US012679721B2

(12) United States Patent (10) Patent No.: US 12,679,721 B2
Boy et al. (45) Date of Patent: Jul. 14, 2026

(54) MICROMECHANICAL DEVICE COMPRISING A HYDROGEN DRAINAGE LAYER

(71) Applicant: Robert Bosch GmbH, Stuttgart (DE)

(72) Inventors: Johannes Boy, Moessingen (DE); Leo Rizzi, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 487 days.

(21) Appl. No.: 18/464,876

(22) Filed: Sep. 11, 2023

(65) Prior Publication Data

US 2024/0124296 A1 Apr. 18, 2024

(30) Foreign Application Priority Data

Oct. 18, 2022 (DE) ...................... 10 2022 210 970.8

(51) Int. Cl.
B81B 7/00 (2006.01)
(52) U.S. Cl.
CPC .... B81B 7/0038 (2013.01); B81B 2203/0315 (2013.01); B81B 2207/012 (2013.01)
(58) Field of Classification Search
None
See application file for complete search history.

(56) References Cited

U.S. PATENT DOCUMENTS 9,508,663 B2 * 11/2016 Kim .................... B81C 1/00238
9,643,838 B1 5/2017 Chu et al.

2008/0157339 A1 * 7/2008 O Suilleabhain ....... B81B 7/007
                                                  257/E23.18
2010/0072626 A1 * 3/2010 Theuss ................ H01L 25/0657
                                                  257/E23.141
2010/0314544 A1 12/2010 Ouvrier-Buffet
2013/0105959 A1 5/2013 Baillin et al.
2018/0346321 A1 * 12/2018 Takubo .............. B81C 1/00269
2020/0299128 A1 * 9/2020 Suzuki ................ B81C 1/00309

FOREIGN PATENT DOCUMENTS

DE 112014004867 B4 12/2021

OTHER PUBLICATIONS

Wolfgang Reinert, "Neon Ultra-Fine Leak Test for Predicting the Vacuum Maintenance of Resonant Microsensors (Neon Ultra-Feinlecktest Zur Vorhersage Der Vakuumerhaltung Resonanter Mikrosensoren)," Dissertation at the Technical University of Kiel, 2006, pp. 1-150.
Marlene Kopf, "Long-Term Stability of the Internal Pressures of Cavities of Adjacent Silicon-Based MEMS Sensors (Langzeitstabilität Der Innendrücke Von Kavernen Benachbarter Mems-Sensoren Auf Siliziumbasis)," Dissertation at the Karlsruhe Institute of Technology, 2020, pp. 1-221.

* cited by examiner

*Primary Examiner* — Benjamin P Sandvik
(74) *Attorney, Agent, or Firm* — NORTON ROSE FULBRIGHT US LLP

(57) ABSTRACT

A micromechanical device. The device includes a MEMS chip which comprises a cavity; an IC chip which includes an IC substrate and at least one IC functional layer, wherein the IC chip is connected to the MEMS chip such that the IC functional layer is disposed between the IC substrate and the cavity. The IC chip includes a hydrogen drainage layer which is disposed between the IC functional layer and the cavity.

4 Claims, 3 Drawing Sheets

MICROMECHANICAL DEVICE COMPRISING A HYDROGEN DRAINAGE LAYER

CROSS REFERENCE

The present application claims the benefit under 35 U.S.C. § 119 of German Patent Application No. DE 10 2022 210 970.8 filed on Oct. 18, 2022, which is expressly incorporated herein by reference in its entirety.

FIELD

The present invention relates to a micromechanical device with a MEMS chip which comprises a cavity; an IC chip which comprises an IC substrate and at least one IC functional layer, wherein the IC chip is connected to the MEMS chip such that the IC functional layer is disposed between the IC substrate and the cavity.

BACKGROUND INFORMATION

Micromechanical sensors are hermetically sealed off from the surrounding atmosphere by wafer bonding processes; on the one hand to make them impervious to environmental influences and, on the other hand, to selectively enclose specific gases, which is essential for the functioning of the sensors. In the finished state, the micromechanics themselves are disposed in a hollow space, the cavity. If the cap wafer is made of a microstructured silicon wafer, it forms a robust seal. Alternatively, this cap wafer is replaced with a microstructured IC chip, which reduces the size of the micromechanical device and reduces the overall cost. The IC chip consists of different metallic, semiconducting and dielectric layers, which can contain a high proportion of hydrogen as a result of the manufacturing process. At high temperatures or over a sufficiently long period of time, the hydrogen diffuses out of the IC chip, preferably in the direction of the sensor element.

The hydrogen entering the sensor cavity changes the internal pressure there, which leads to a variation of the final component properties during manufacturing and to defective parts and lack of long-term stability during use. To prevent hydrogen diffusion, a barrier layer can be applied to the IC chip, for example, which prevents hydrogen from entering the cavity. Said layer has to be structured to expose the bond frame or chip-to-chip contacts, however, which inevitably creates permeable surfaces. In combination with some other technologies, a hydrogen barrier likewise cannot to be applied over the entire surface, and is then, on its own, not sufficient to ensure the stability of the internal pressure.

SiO2 is a suitable material for hydrogen diffusion. This was studied in the papers of Wolfgang Reinert, "Neon ultra-fine leak test for predicting the vacuum maintenance of resonant microsensors"-Dissertation at the Technical University of Kiel, 2006, for example, and Marlene Kopf, "Long-term stability of the internal pressures of cavities of adjacent silicon-based MEMS sensors"-Dissertation at the Karlsruhe Institute of Technology, 2020.

SUMMARY

An object of the present invention is to reduce or completely prevent the entry of hydrogen into a MEMS cavity.

The present invention relates to a micromechanical device with a MEMS chip which comprises a cavity; an IC chip which comprises an IC substrate and at least one IC functional layer, wherein the IC chip is connected to the MEMS chip such that the IC functional layer is disposed between the IC substrate and the cavity.

According to an example embodiment of the present invention, the IC chip comprises a hydrogen drainage layer which is disposed between the IC functional layer and the cavity.

The present invention advantageously allows the hydrogen outgassing from the IC chip to be discharged into the surrounding atmosphere by means of a hydrogen-permeable layer (drainage layer). Hydrogen can therefore then not only diffuse in the direction of the cavity, but is preferably discharged to the outside. This leads to increased internal pressure stability in the cavity. This in particular ensures the functioning of micromechanical sensors that comprise MEMS components in the cavity and rely on a specific atmospheric internal pressure. The present invention thus solves the problem of loss of function and lack of long-term stability of the sensors due to the entry of hydrogen into the cavity.

An advantageous example embodiment of the present invention provides that the IC chip comprises a hydrogen barrier layer which is disposed between the hydrogen drainage layer and the cavity. This advantageously further reduces the entry of hydrogen into the cavity. When the hydrogen barrier is used, the prior discharge of hydrogen causes a significant reduction in the load on the barrier, which likewise leads to increased long-term stability of the pressure in the cavity.

An advantageous example embodiment of the present invention provides that at least one sealing ring, which is in particular made of metal and seals an inner region of the IC functional layer against an outer region, is disposed in the IC functional layer. This advantageously protects IC functions from environmental influences. The hydrogen drainage layer according to the present invention nonetheless discharges enough hydrogen, so that the diffusion pressure toward the cavity is sufficiently reduced.

It is particularly advantageous here if the sealing ring also extends through the hydrogen drainage layer to the MEMS chip, wherein the sealing ring is partly perforated in the hydrogen drainage layer, i.e. has perforations that connect the inner region to the outer region in a hydrogen-conducting manner. Sufficient hydrogen permeability in the hydrogen drainage layer can be brought about via the type and size of the perforations.

DETAILED DESCRIPTION OF EXAMPLE EMBODIMENTS

Figure 1:
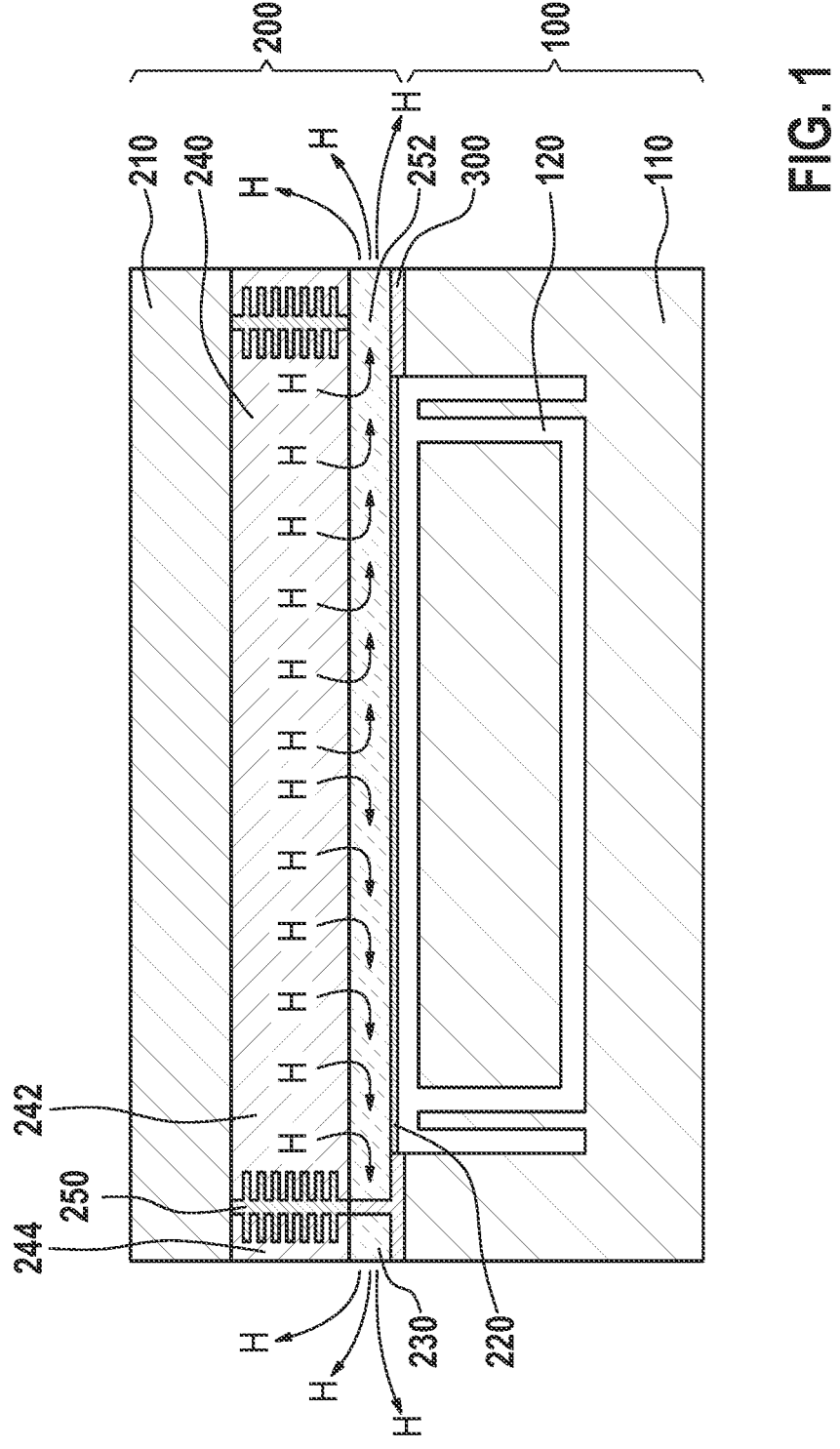
FIG. 1 schematically shows a micromechanical device according to an example embodiment of the present invention comprising a hydrogen drainage layer.

FIG. 1 schematically shows a micromechanical device according to the present invention comprising a hydrogen drainage layer. A micromechanical device with a MEMS chip 100 which comprises a MEMS substrate 110 and a cavity 120 and an IC chip 200 which comprises an IC substrate 210 and at least one IC functional layer 240 is shown. The IC chip is connected to the MEMS chip such that the IC functional layer is disposed between the IC substrate and the cavity. The IC chip comprises a hydrogen drainage layer 230 which is disposed between the IC functional layer and the cavity. Hydrogen (H) can outgas from the IC functional layer to the atmosphere via this drainage layer.

The IC chip also comprises a hydrogen barrier layer 220 which is disposed between the hydrogen drainage layer and the cavity. The MEMS chip and the IC chip are connected to one another by means of a bond frame 300. A sealing ring 250, which is made of metal and seals an inner region 242 of the IC functional layer against an outer region, 244 is disposed in the IC functional layer.

The IC chip is an application-specific integrated circuit (ASIC), for example. The layer system of this integrated circuit, including metal layers, is not shown in detail here, but is instead included in the IC functional layer.

Silicon oxide, preferably SiO2, which is deposited in the manufacturing process using tetraethyl orthosilicate and chemical vapor deposition (CVD), is a suitable material for the hydrogen drainage layer. Via this layer, hydrogen can outgas from the layer system of the IC chip into the environment instead of into the micromechanical cavity. The drainage layer is ideally as impermeable as possible to all other gaseous species.

The MEMS chip and the IC chip are connected to one another on a bond frame 300. This connection is produced in a wafer bonding process.

In practice, the implementation of the basic principle still requires consideration of the chip-to-chip contacts and the sealing ring.

Figure 2A:
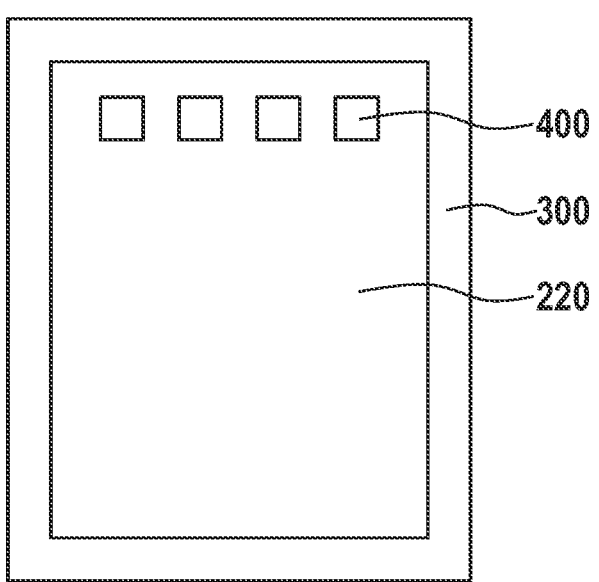
FIGS. 2A and 2B schematically show a micromechanical device according to an example embodiment of the present invention comprising chip-to-chip contacts.
Figure 2B:
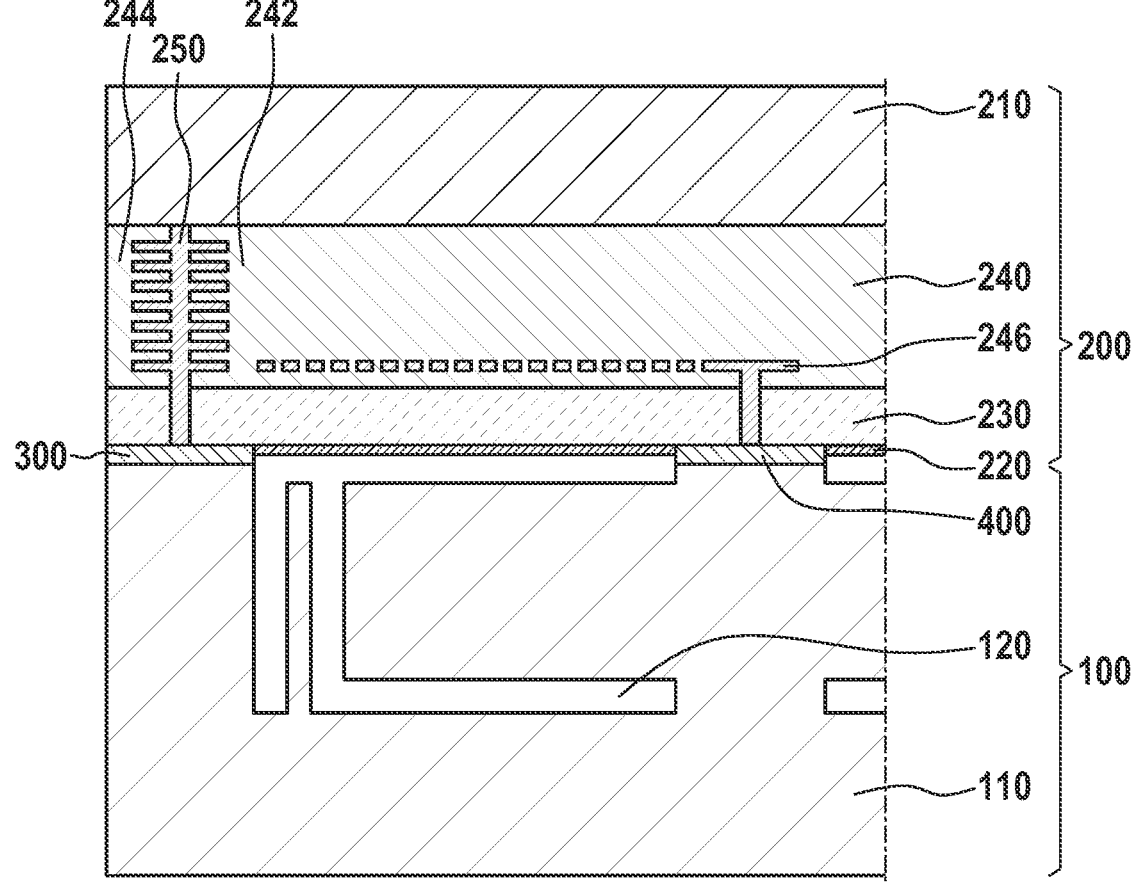

FIGS. 2A and 2B schematically show a micromechanical device according to the present invention comprising chip-to-chip contacts.

FIG. 2A shows a plan view onto the IC surface that faces toward the MEMS chip. The bond frame 300 and the hydrogen barrier layer 220, which is traversed by chip-to-chip contacts 400, are shown. The chip-to-chip contacts electrically connect the IC to the MEMS. They are metallic and, just like the bond frame, are connected to one another during wafer bonding. Therefore, if a drainage layer is introduced, the chip-to-chip contacts have to perforate both the top layer and the drainage layer of the IC, which is made possible with suitable structuring: For this purpose, the SiO2 is applied over the entire surface. The SiO2 is removed locally using lithography and etching and filled in with electrically conductive material. The surface is smoothed again using chemical-mechanical polishing.

FIG. 2B shows a vertical section through a section of the micromechanical device and a chip-to-chip contact 400. The IC chip 200 is bonded on its functional side to the MEMS chip 100. The cavity 120 is thus covered and sealed. The chip-to-chip contacts 400 on the IC meet the respective counterpart on the MEMS side and, in the bonding process, are connected to one another and to the bond frame 300 in a material-locking and electrically conductive manner. The connection of the chip-to-chip contacts or the bond frame to the interior of the IC, i.e. the IC functional layer 240, is realized through openings in the hydrogen drainage layer 230. The sealing ring 250 is a circumferential metallic barrier located in the IC that is intended to protect the individual IC chips, and later the finished single micromechanical device of MEMS chip connected to the IC chip, from external influences such as moisture. The sealing ring 250 seals the inner region 242 of the IC functional layer against an outer region 244.

Figure 3A:
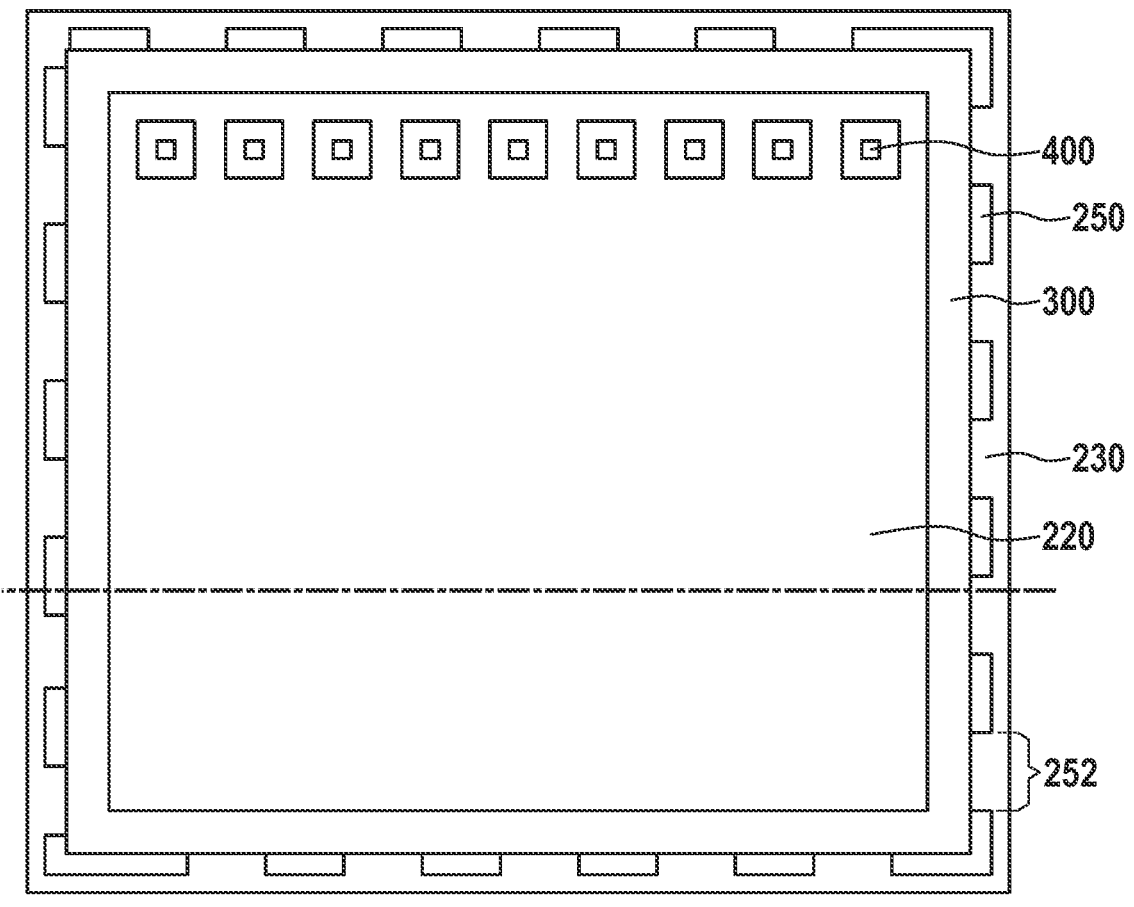
FIGS. 3A and 3B schematically show a micromechanical device according to an example embodiment of the present invention comprising a perforated sealing ring.
Figure 3B:
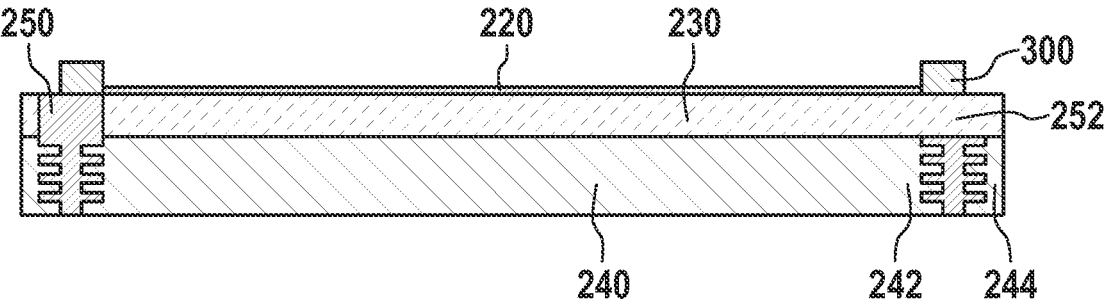

FIGS. 3A and 3B schematically show a micromechanical device according to the present invention comprising a perforated sealing ring.

FIG. 3A shows a plan view onto the IC surface that faces toward the MEMS chip. The bond frame 300 and the hydrogen barrier layer 220, which is traversed by chip-to-chip contacts 400, are shown. The sealing ring 250, which traverses the hydrogen drainage layer 230 and comprises perforations 252, is shown as well.

FIG. 3B shows a vertical section through a section of the IC chip and a perforated sealing ring 250. For hydrogen to be discharged from the inside to the outside as easily as possible, this sealing ring has to be partly perforated. Otherwise, it could be too great a barrier to the outgassing hydrogen. The sealing ring therefore comprises the perforations 252 in the hydrogen drainage layer 230. Here too, for production, the drainage layer can be processed using the above-described structuring and filling in such a way that the sealing ring does indeed extend over the entire height of the IC to the bond frame. But, some spaces for drainage are left open.

LIST OF REFERENCE SIGNS

100 MEMS chip
110 MEMS substrate
120 Cavity
200 IC chip
210 IC substrate
220 Hydrogen barrier layer
230 Hydrogen drainage layer
240 IC functional layer
242 Inner region
244 Outer region
246 Metal layer
250 Sealing ring
252 Perforation
300 Bond frame
400 Chip-to-chip contact

What is claimed is:

1. A micromechanical device, comprising:
   a MEMS chip which includes a cavity;
   an IC chip which includes an IC substrate and at least one IC functional layer, wherein the IC chip is connected to the MEMS chip such that the IC functional layer is disposed between the IC substrate and the cavity;
   wherein the IC chip includes a hydrogen drainage layer which is disposed between the IC functional layer and the cavity, and wherein the hydrogen drainage layer is configured to discharge hydrogen to outside the device.

2. The micromechanical device according to claim 1, wherein the IC chip includes a hydrogen barrier layer which is disposed between the hydrogen drainage layer and the cavity.

3. The micromechanical device according to claim 1, further comprising:
   at least one sealing ring which is made of metal and seals an inner region of the IC functional layer against an outer region, the at least one sealing ring being disposed at least in the IC functional layer.

4. The micromechanical device according to claim 3, wherein the sealing ring extends through the hydrogen drainage layer and includes perforations in the hydrogen drainage layer.

* * * * *